(12) United States Patent
Le (10) Patent No.: US 6,908,038 B1
(45) Date of Patent: *Jun. 21, 2005

(54) MULTI-CONNECTOR MEMORY CARD WITH RETRACTABLE SHEATH TO PROTECT THE CONNECTORS

(75) Inventor: Trung V. Le, White Bear Township, MN (US)

(73) Assignee: Imotion Corp., Oakdale, MN (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/788,591

(22) Filed: Feb. 27, 2004

(51) Int. Cl.[7] .............................................. G06K 19/06
(52) U.S. Cl. ......................... 235/492; 361/737; 710/62; 439/638
(58) Field of Search ................................ 235/441, 492; 361/737; 439/141, 638

(56) References Cited

U.S. PATENT DOCUMENTS

| | | | |
|---|---|---|---|
| 6,148,354 A | 11/2000 | Ban et al. | |
| 6,381,143 B1 | 4/2002 | Nakamura | |
| 6,385,677 B1 | 5/2002 | Yao | |
| 6,407,940 B1 | 6/2002 | Aizawa | |
| 6,490,667 B1 | 12/2002 | Ikeda | |
| 6,501,163 B1 | 12/2002 | Utsumi | |
| 6,567,273 B1 | 5/2003 | Liu et al. | |
| 6,616,053 B2 | 9/2003 | Kondo et al. | |
| 6,618,789 B1 | 9/2003 | Okaue et al. | |
| 6,654,841 B2 | 11/2003 | Lin | |
| 2002/0147882 A1 * | 10/2002 | Pua et al. | 711/103 |
| 2002/0177362 A1 * | 11/2002 | Chang | 439/638 |
| 2002/0195500 A1 | 12/2002 | Maruyama | |
| 2003/0095386 A1 | 5/2003 | Le et al. | |
| 2004/0090751 A1 * | 5/2004 | Choi et al. | 361/726 |

FOREIGN PATENT DOCUMENTS

| | | |
|---|---|---|
| CN | 1304115 | 7/2001 |
| EP | 1 132 824 A2 | 9/2001 |
| EP | 1 197 826 A1 | 4/2002 |

OTHER PUBLICATIONS

Co–pending U.S. Appl. No. 10/644,484, filed Aug. 20, 2003, Trung V. Le, entitled "Memory Card Compatible with Multiple Connector Standards".
Co–pending U.S. Appl. No. 10/788,594, filed Feb. 27, 2004, Trung V. Le et al., entitled "Memory Card Host Connector with Retractable Shieldless Tab".
Co–pending U.S. Appl. No. 10/788,600, filed Feb. 27, 2004, Trung V. Le et al., entitled "Credit Card Sized Memory Card with Host Connector".
Co–pending U.S. Appl. No. 10/788,623, filed Feb. 27, 2004, Trung V. Le, entitled "Memory Card Compatible with Device Connector and Host Connector Standards".

* cited by examiner

Primary Examiner—Thien M. Le
Assistant Examiner—Daniel A. Hess
(74) Attorney, Agent, or Firm—Eric D. Levinson (57) ABSTRACT

The invention is directed to a multi-connector memory card that includes a device connector and a connector that conform to a device connection standard and a host connection standard respectively. The dimensions of the memory card may substantially conform to dimensions of a memory card standard, such as a MultiMedia Card standard or a Secure Digital standard. A retractable sheath fits over a housing of the memory card to protect electrical contacts on the device-connector and the host connector. In particular, the retractable sheath that can be positioned in a first position to cover the host connector and expose the device connector, and a second position to cover the device connector and expose the host connector.

20 Claims, 7 Drawing Sheets

MULTI-CONNECTOR MEMORY CARD WITH RETRACTABLE SHEATH TO PROTECT THE CONNECTORS

TECHNICAL FIELD

The invention relates to removable storage media devices and, in particular, removable memory cards.

BACKGROUND

A wide variety of removable storage media exist for use with voice recorders, digital video camcorders, digital cameras, personal digital assistants (PDAs), cellular phones, video games, digital televisions, photo printers, and the like. The removable storage media allow users to capture and store data on such devices, and easily transport the data between these various devices and a computer.

One of the most popular types of removable storage media is the flash memory card, which is compact, easy to use, and has no moving parts. A flash memory card includes an internal, high-speed solid-state memory capable of persistently storing data without application of power. Numerous other memory standards can also be used in memory cards, including electrically-erasable-programmable-read-only-memory (EEPROM), non-volatile random-access-memory (NVRAM), and other non-volatile or volatile memory types, such as synchronous dynamic random-access-memory (SDRAM), with battery backup.

A wide variety of memory cards have been recently introduced, each having different capacities, access speeds, formats, interfaces, and connectors. Examples of memory cards include CompactFlash™ (CF) first introduced by SanDisk™ Corporation, the Memory Stick™ (MS) and subsequent versions including Memory Stick Pro and Memory Stick Duo developed by Sony Corporation, Smart Media™ memory cards, Secure Digital (SD) memory cards, and MultiMedia Cards (MMCs) jointly developed by SanDisk Corporation and Siemens AG/Iinfineon Technologies AG, and xD™ digital memory cards developed by Fuji.

Each of the different memory cards typically has a unique connector, which defines the electrical and mechanical interfaces of the card. Moreover, each different memory card generally requires a specialized adapter or reader for use with a host computing device. The adapter or reader includes a specialized interface that conforms to that of the memory card, and an interface that can be accepted by a host computer. For example, an adaptor or reader may include a device interface to receive a memory card and a host computer interface to connect to a host computer, such as a personal computer memory card international association (PCMCIA) standard including a 16 bit standard PC Card standard and a 32 bit CardBus standard, a Universal Serial Bus (USB) standard, a Universal Serial Bus 2 (USB2) standard, an IEEE 1394 FireWire standard, a Small Computer System Standard (SCSI) standard, an Advance Technology Attachment (ATA) standard a serial ATA standard, a Peripheral Component Interconnect (PCI) standard, a PCI Express standard, a conventional serial or parallel standard, or the like.

Conventional memory cards have only one connector to interface with a device. The same connector also interfaces with the adaptor or reader to allow the memory card to be read by a host computer. Most conventional adapters and readers support only a single type of memory card, causing a user to carry and interchange adapters or readers when using different types of memory cards.

SUMMARY

The invention is directed to a multi-connector memory card that includes a device connector and a host connector that conform to a device connection standard and a host connection standard respectively. The dimensions of the memory card may substantially conform to dimensions of a memory card standard, such as a MultiMedia Card standard or a Secure Digital standard.

The MultiMedia Card standard and Secure Digital standard are unique relative to various other memory card standards in that these standards define unprotected electrical contacts on the surface of the memory card. In particular, the unprotected electrical contacts are formed directly on the housing of the memory card. In conventional memory cards, this does not present a problem because a user typically handles the opposing side of the card when inserting the card into a device. In accordance with the invention, however, a host connector is included on the memory card, in addition to the device connector. For this reason, protection of the electrical contacts of the device connector becomes more of a concern because a user may need to handle the memory card proximate the device connector in order to insert the host connector into a host computer. Protection of the host connector is also a major concern when the device connector is being used, particularly if the host connector is fragile.

The invention contemplates a retractable sheath that fits over the housing of the memory card to protect the device connector when the host connector is exposed, and to protect the host connector when the device connector is exposed. In particular, the retractable sheath can protect the respective connectors from damage, electrostatics, or debris during use of the memory card. For example, a user may hold the memory card by the retractable sheath when the memory card is inserted into a device, or when the memory card is in transport. The retractable sheath reduces the risk of damage by substantially preventing the user from contacting the device connector or the host connector. The retractable sheath allows one but not both of the connectors to be exposed at any given time.

In one embodiment, the invention is directed to a memory card comprising a housing and a memory in the housing. The memory card includes a device connector and a host connector. In particular, the device connector is formed on the housing and conforms to a device connection standard such as MultiMedia, Secure Digital or another standard that has connectors exposed and unprotected on the housing. The device connector allows access to the memory by a device compatible with the device connection standard. The host connector protrudes from the housing and conforms to a host connection standard, such as the Universal Serial Bus (USB) standard. The host connector allows access to the memory upon insertion of the host connector into a computer interface compatible with the host connection standard.

The housing and the host connector protruding from the housing may define memory card dimensions which substantially conform to dimensions of a standard associated with the device connector, e.g., including a height of approximately 32 mm, and a width of approximately 24 mm. Moreover, the memory card may further comprise a retractable sheath that can be positioned in a first position to cover the host connector and expose the device connector, and a second position to cover the device connector and expose the host connector.

In another embodiment, the invention is directed to a memory card comprising a housing, a memory device in the housing, a device connector, a host connector, and a retractable sheath. The device connector includes one or more electrical contacts on the housing, conforms to a device connection standard, and allows access to the memory by a device compatible with the device connection standard. The host connector protrudes from the housing, conforms to a host connection standard, and allows access to the memory upon insertion of the host connector into a computer interface compatible with the host connection standard. The retractable sheath can be positioned in a first position to cover the host connector and expose the device connector, and a second position to cover the device connector and expose the host connector. In some cases, the housing and the retractable sheath collectively define a form factor of the memory card that substantially conforms to a form factor of the memory card standard when the retractable sheath is positioned in the first position to cover the host connector.

The invention is capable of providing one or more advantages. For example, the need for an adapter or reader to couple the memory card to a computing device is eliminated. Instead, the memory card can be coupled directly to a host computer device without using an adaptor or reader. Accordingly, the memory card can be inserted into a portable device that conforms to the memory card standard or inserted directly into a host computer interface, such as a USB interface.

In addition, the retractable sheath can protect the host connector or the device connector from damage. In particular, the retractable sheath can protect the respective connectors from damage, electrostatics, or debris during use of the other connector of the memory card. The retractable sheath allows one but not both of the connectors to be exposed at any given time. If a given connector is being used, the other connector is protected by the retractable sheath.

In some cases, the host connector comprises a shieldless USB tab. For example, the shieldless USB tab may be a Universal Serial Bus (USB) tab without a conventional electrical shield. In that case, the sheath can protect the shieldless USB tab from user handling when the user holds the card for insertion of the card into a portable device compatible with the device connector. A shieldless USB tab is substantially thinner than a conventional USB interface that includes the shield, and much more fragile than a USB interface that includes the shield. Accordingly, protection of the shieldless USB tab when the device connector is being used can help ensure against breakage of the shieldless USB tab. The elimination of the shield is also advantageous because the elimination of the shield ensures that substantial thickness is not added to that could undermine insertion of the memory card into a portable device.

The details of one or more embodiments of the invention are set forth in the accompanying drawings and the description below. Other features, objects, and advantages of the invention will be apparent from the description and drawings, and from the claims.

DETAILED DESCRIPTION

The invention is directed to a multi-connector memory card that includes a device connector and a host connector that conform to a device connection standard and a host connection standard respectively. The host connector may comprise a shieldless tab. In that case, the elimination of the shield allows the card to maintain a thickness compatible with memory card standards. The memory card may also include a retractable sheath that can be positioned in a first position to cover the host connector and expose the device connector, and a second position to cover the device connector and expose the host connector. In other words, the retractable sheath allows one but not both of the connectors to be exposed at any given time. In some cases, the housing and the retractable sheath collectively define a form factor of the memory card that substantially conforms to a form factor of the memory card standard when the retractable sheath is positioned in the first position to cover the host connector.

Some memory card standards, such as the MultiMedia Card standard and the Secure Digital standard are unique in that these standards define unprotected electrical contacts on the memory card. In particular, the unprotected electrical contacts are formed directly on the housing of the memory card. In conventional memory cards, this does not present a problem because a user typically handles the opposing side of the card when inserting the card into a device. In accordance with the invention, however, a host connector is included on the memory card, in addition to the device connector. For this reason, protection of the electrical contacts of the device connector becomes more of a concern because a user may need to handle memory card proximate the device connector in order to insert the host connector into a host computer. Protection of the host connector is also a major concern when the device connector is being used, particularly if the host connector is fragile. The elimination of a conventional host connector shield can add to the fragile nature of a host connector on a memory card.

The invention contemplates a retractable sheath that fits over the housing of the memory card to protect the device connector when the host connector is exposed, and to protect the host connector when the device connector is exposed. In particular, the retractable sheath can protect the respective connectors from damage, electrostatics, or debris during use of the memory card. For example, a user may hold the memory card by the retractable sheath when the memory card is inserted into a device, or when the memory card is in transport. The retractable sheath reduces the risk of damage by substantially preventing the user from contacting the device connector or the host connector. The retractable sheath allows one but not both of the connectors to be exposed at any given time.

Figure 1:
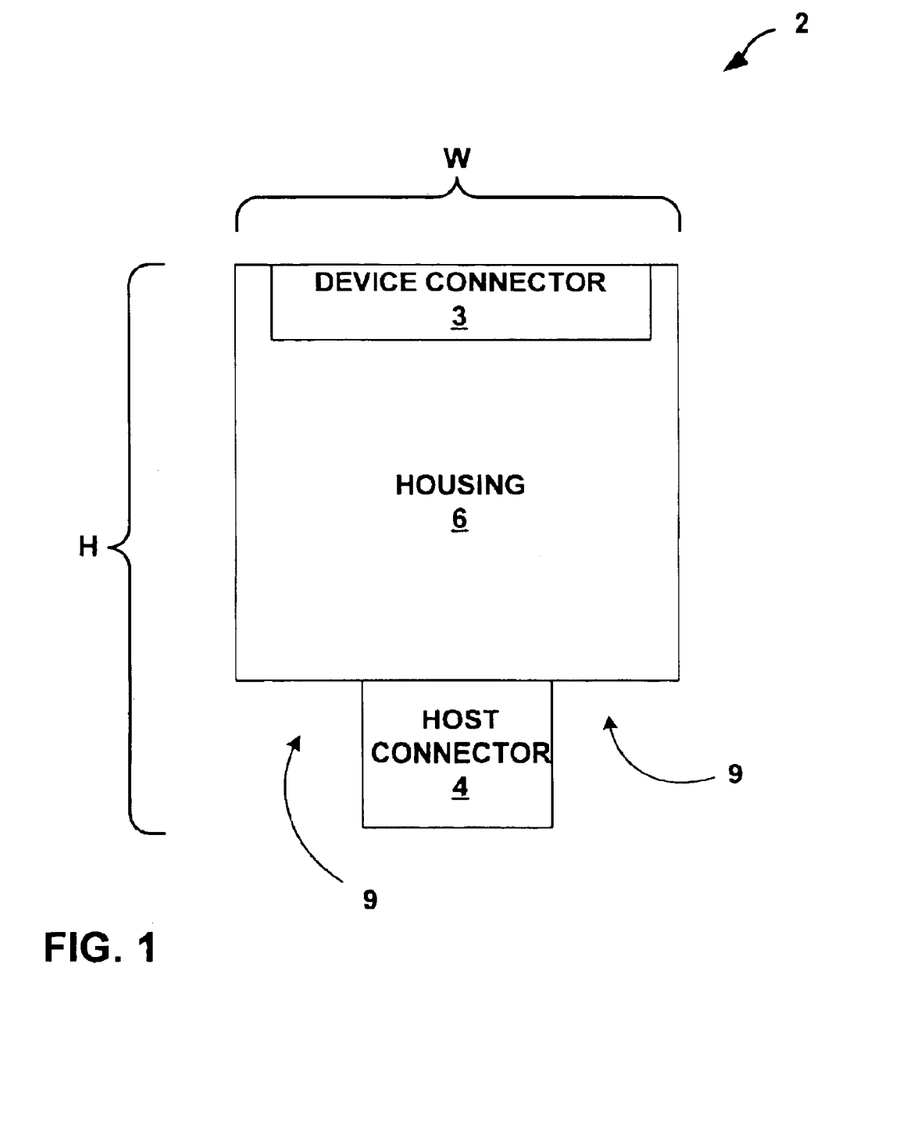
FIG. 1 is a block diagram of an exemplary multi-connector memory card that includes a device connector and a host connector that conform to a device connection standard and a host connector standard respectively.

FIG. 1 is a block diagram of an exemplary multi-connector memory card 2 that includes a device connector 3 and a host connector 4 that conform to a device connection standard and a host connector standard respectively. The dimensions of memory card 2 may substantially conform to dimensions of a memory card standard, such as a MultiMedia Card standard or a Secure Digital standard. More specifically, the dimensions of memory card 2 may include a height (H) of approximately 32 mm and a width (W) of approximately 24 mm. The thickness of memory card 10 may be approximately 1.4 mm or approximately 2.1 mm. This ensures that the memory card can be accepted by portable devices compatible with the memory card standard associated with device connector 3.

Device connector 3 includes unprotected electrical contacts, e.g., formed on housing 6. Host connector 4 may comprise a relatively fragile shieldless tab, such as a tab conforming to a Universal Serial Bus (USB) standard without a conventional electrical shield. A shield is used in conventional USB applications to improve a physical wire connection and signal transmission. However, on memory card 2 the wire is eliminated and USB tab connects memory card 2 directly to a USB port without any additional wire.

A shieldless USB tab is much thinner than a conventional USB interface that includes the shield. Accordingly, elimination of the shield ensures that host connector 4 does not add thickness to memory card 2 that could undermine insertion of the memory card into a portable device. In accordance with the invention, other standards may similarly be supported via a shieldless tab, i.e., non-USB standards in which a shield is conventionally included on the connector used but could be eliminated on memory card 2.

A retractable sheath (not shown in FIG. 1) may fit over a housing 6 of memory card 2 to protect electrical contacts on device connector 3 or host connector 4. In particular, the retractable sheath may protect the connectors from damage, electrostatics, or debris during use of the memory card. For example, a user may hold memory card 2 by the retractable sheath when memory card 2 is inserted into a device, or when memory card 2 is in transport. The retractable sheath reduces the risk of damage by substantially preventing the user from contacting device connector 3 or host connector 4. In particular, the retractable sheath allows one but not both of the connectors to be exposed at any given time There may be irregularities in the shape of memory card 2 that are not consistent with the form factor of the memory card standard. For example, the form factor (or shape) of memory card 2 may include one or more voids 9 that would correspond to portions of a housing of a conventional memory card. Thus, while the dimensions of memory card 2 may correspond to the dimensions defined by the standard, the form factor may be different. The addition of a sheath over housing 6, however, can ensure compliance with the form factor of the memory card standard when the host connector is covered and the device connector is exposed. Such compliance with the form factor of the standard improves the aesthetics of the memory card and also allows for compatibility with memory card accessories, such as storage case, or other accessories that are affected by the form factor of the memory card. In some cases, a specific form factor for memory card 2 may be necessary to gain commercial acceptance for certain applications. For example, some portable devices may require that the form factor of memory card 2 conforms to the form factor of the memory card standard.

Figure 2:
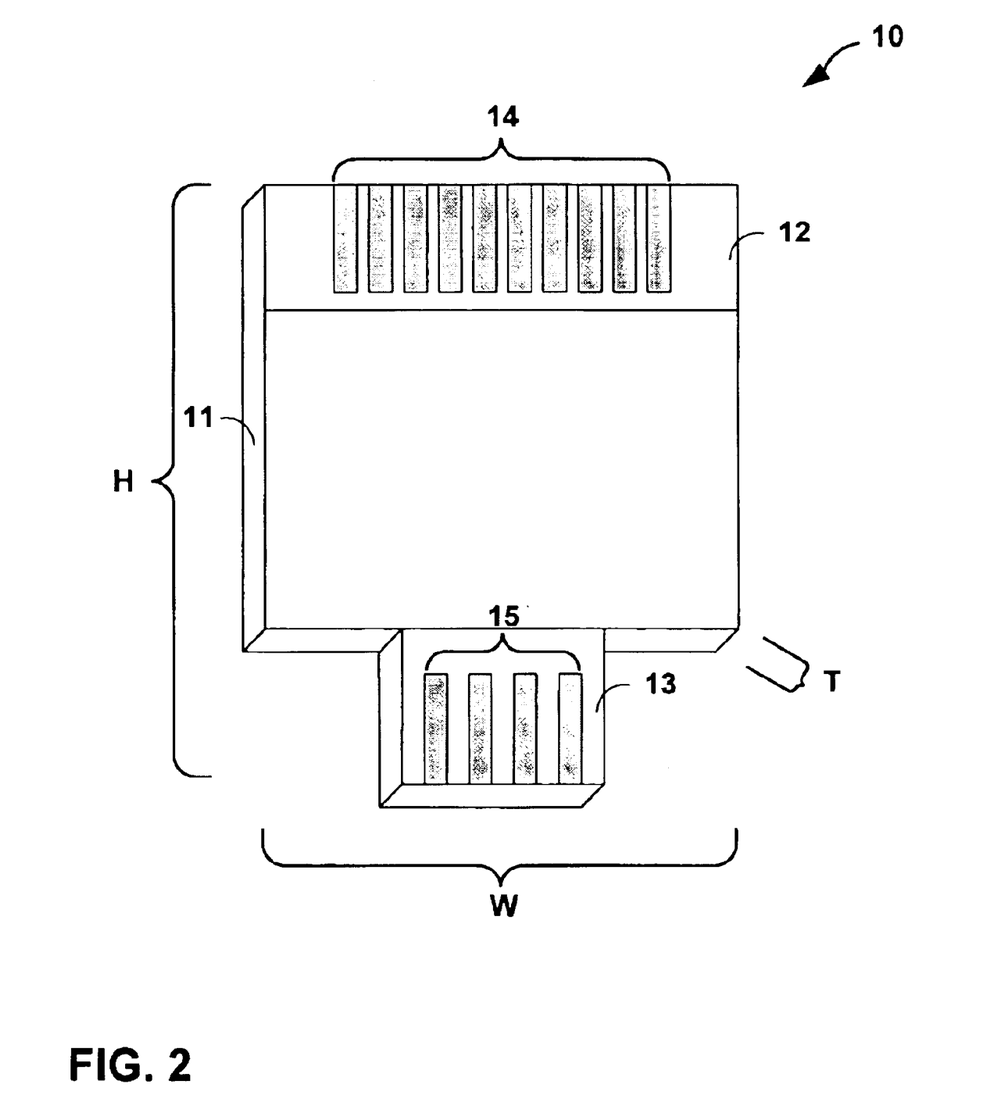
FIG. 2 is a perspective view of an exemplary memory card that includes a device connector on a housing and a host connector in the form of a shieldless tab protruding from the housing.

FIG. 2 is a perspective view of an exemplary memory card 10 that includes a device connector 12 on housing 11 and a shieldless tab 13 protruding from the housing. Again, shieldless tab 13 is one example of a host connector in accordance with the invention. In other examples, different types of host connectors may be used with or without shields. In order to support USB, however, the elimination of the conventional shield may be necessary in order to ensure that the thickness of memory card 10 does not present problems. This is particularly the case for any standard for which the card thickness defined by the standard is less than the thickness of a conventional USB shield.

Housing 11 and shieldless tab 13 define memory card dimensions that substantially conform to dimensions of a memory card standard. For example, the dimensions of memory card 10 substantially conform to the dimensions of a MultiMedia Card standard or a Secure Digital standard. More specifically, the dimensions of memory card 10 may include a height (H) of approximately 32 mm and a width (W) of approximately 24 mm. In one embodiment, the dimensions of memory card 10 include a thickness (T) of approximately 1.4 mm or approximately 2.1 mm.

Device connector 12 includes unprotected electrical contacts 14, e.g., formed on housing 11. Shieldless tab 13 may conform to a Universal Serial Bus (USB) standard without a conventional electrical shield. Accordingly, shieldless tab 13 is more fragile than conventional USB plugs which include a tab protected by the conventional shield.

In other embodiments, shieldless tab 13 may conform to a 13 bit standard PC Card standard and a 32 bit standard CardBus standard, a Universal Serial Bus 2 (USB2) standard or a future generation USB standard. In still other embodiments shieldless tab 13 could conform to an IEEE 1394 FireWire standard, a Small Computer System Interface (SCSI) standard, an Advance Technology Attachment (ATA) standard, a serial ATA standard, a Peripheral Component Interconnect (PCI) standard, a PCI Express standard, a conventional serial or parallel standard, or another host connector standard.

Again, device connector 12 of memory card 10 conforms to either a MultiMedia Card standard or a Secure Digital standard. In this case, it is necessary to limit the thickness of shieldless tab 13 so the thickness of shieldless tab 13 does not exceed the thickness (T) of memory card 10. For a USB compatible tab, the elimination of the shield meets this goal. Thus, the thickness of the shieldless USB tab may be such that memory card 10 can be inserted into a portable device designed to receive conventional memory cards.

As shown in FIG. 2, shieldless tab 13 is placed opposite from the device connector 12. However, shieldless tab 13 could be placed in other locations on memory card 10. For example, shieldless tab 13 may be offset relative to the center of the edge. In any case, shieldless tab 13 can be coupled directly to a host computer port conforming to the same host connection standard. In this way, the need for an adapter or reader to couple memory card 10 to a host computer is eliminated.

The inclusion of multiple connectors on memory card 10 can present several problems. For example, a user might hold shieldless tab 13 when inserting memory card 10 into a portable device. Similarly, a user might hold device connector electrical contacts 14 when inserting memory card 10 into a host computer. Handing of electrical contacts 14 is of more concern when electrical contacts 14 are completely unprotected and exposed.

Figure 3:
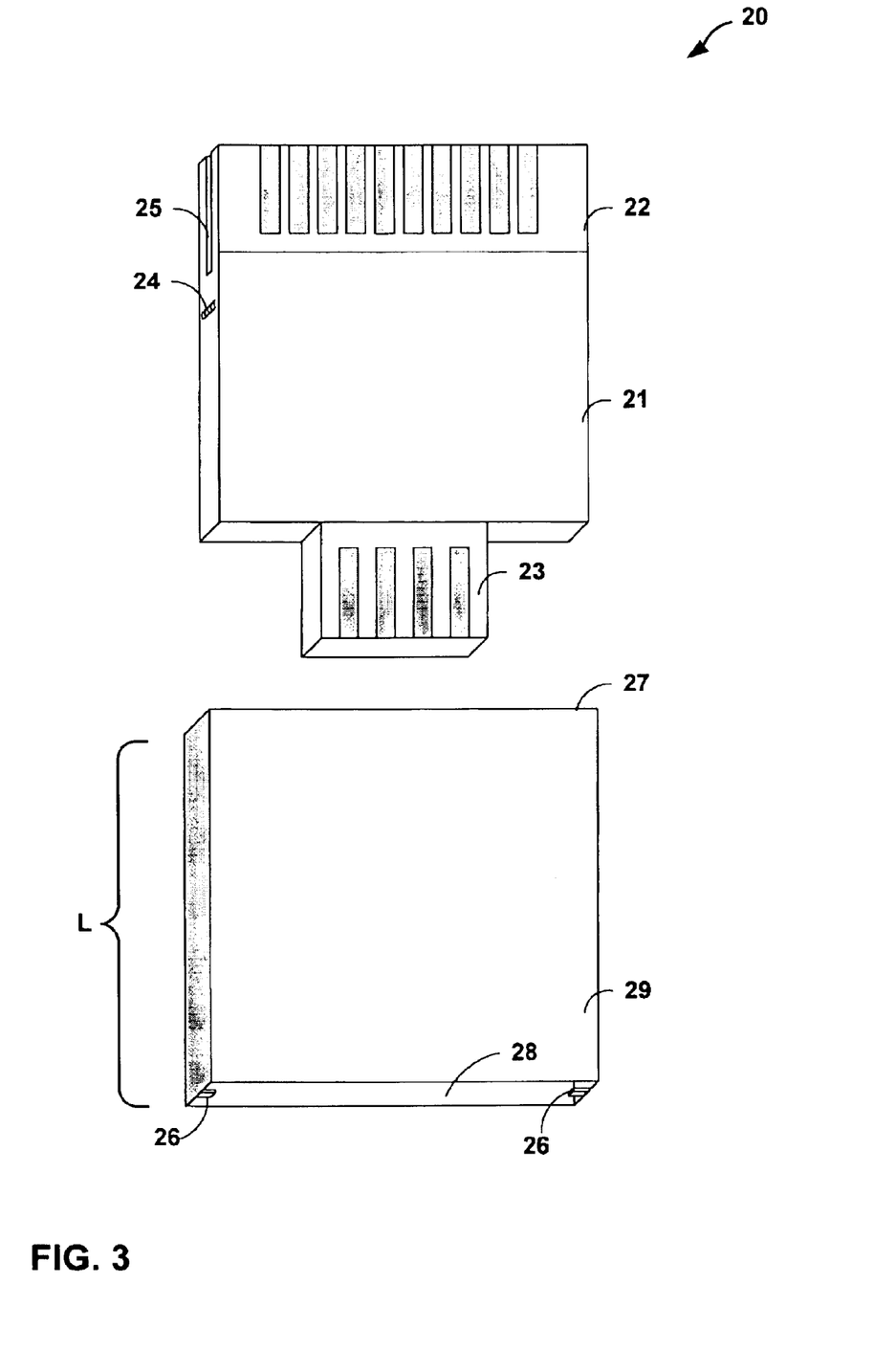
FIG. 3 is a perspective view of an exemplary memory card that includes a retractable sheath that can be positioned to cover a device connector or to cover a shieldless USB tab.

FIG. 3 is an exploded perspective view of an exemplary memory card 20 that includes a retractable sheath 29 that can be positioned to cover a device connector 22 or a shieldless USB tab 23. More specifically, retractable sheath 29 can be positioned in a first position to cover shieldless USB tab 23 and expose device connector 22 via a device connector opening 27. Additionally, retractable sheath 29 can be positioned in a second position to cover device connector 22 and expose USB tab 23 via a host connector opening 28.

Device connector opening 27 defines a size that allows access to device connector 27 when the retractable sheath is in the first position. Host connector opening 28 defines a size that allows access to shieldless USB tab 23 when the retractable sheath is in the second position. Device connector opening 27 may define a size that substantially corresponds to the size of housing 21. Host connector opening 28 may define a size that substantially corresponds to the size of housing 21 or a smaller size that substantially corresponds to the size of USB tab 23.

In one embodiment, the length (L) of retractable sheath 29 may be such that retractable sheath 29 covers either device connector 22 or shieldless USB tab 23, but not both, at any given time. In other words, either device connector 22 extends through device connector opening 27, or shieldless USB tab 23 extends through host connector opening 28.

One or more locking mechanisms and stopping mechanisms may be used to secure sheath 29 to housing 21, and to maintain proper positioning of sheath 29 relative to housing 21. A locking mechanism, for example, may allow retractable sheath 29 to be repositioned or removed from memory card 20 if the locking mechanism is unlocked. In one example, the locking mechanism comprises a protrusion 24 in housing 21. In practice, protrusion 24 moves with friction along an interior wall of sheath 29 until protrusion 24 meets and fits into a complementary indentation formed within the interior wall of sheath 29. Once locked into position, a force is necessary to dislodge protrusion 24 from the complementary indentation. Alternatively, sheath 29 may include protrusion 24, and housing 21 may include the complementary indentation. In either case, locking mechanisms may be disposed on memory card 20 in multiple locations, e.g., so that sheath 29 can be locked in both the first position and the second position.

Memory card 20 may further include one or more stopping mechanisms 26 to prevent sheath 29 from being removed from the rest of memory card 20. Stopping mechanisms 26 limit the travel of sheath 29 relative to housing 21 and do not allow the entire housing 21 to pass through host connector opening 26. Similarly, a second set of stopping mechanisms (not shown), disposed on the opposite end of retractable sheath 29, do not allow the entire housing 21 to pass through device connector opening 27. The second set of stopping mechanisms may slide through grooves 25. In other words, stopping mechanisms for the device connector side of memory card 20 can slide through grooves 25 to limit travel of sheath 29 relative to housing 21. The length of groove 25 allows retractable sheath 29 to retract to a position sufficiently exposes device connector 22.

The locking mechanisms and stopping mechanisms described above are merely exemplary. Many other embodiments of locking mechanisms and stopping mechanisms may be used in accordance with the invention. For example a wide variety of tabs, buttons, or the like could be used to define the motion and locking of sheath 29 relative to housing 21. In some cases, the locking mechanism may comprise a tab or button that a user must press to release retractable sheath 29 from a locked position.

Figure 4A:
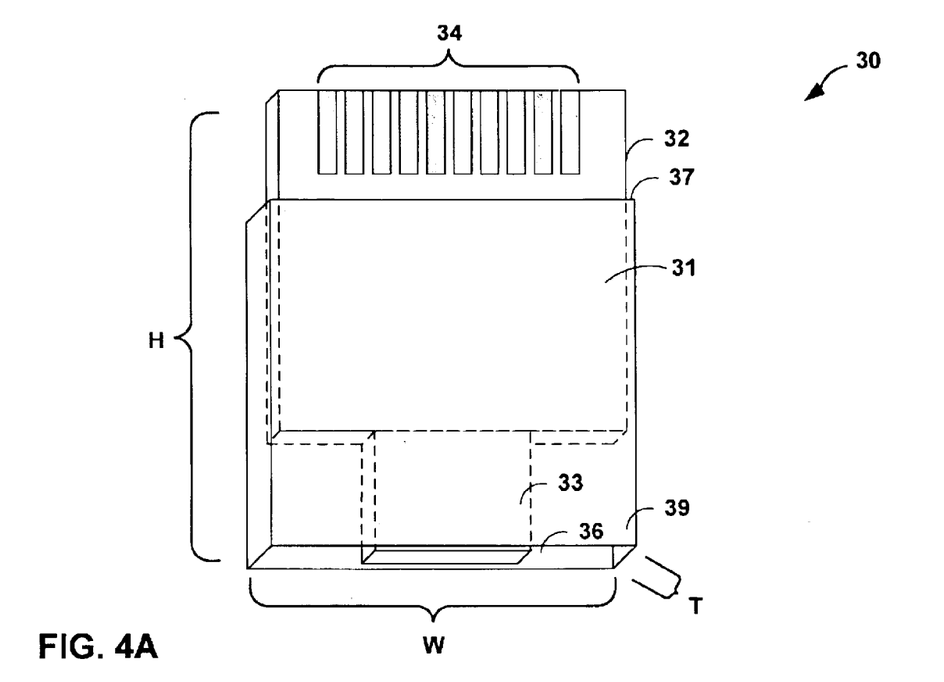
FIGS. 4A and 4B are perspective views of an exemplary memory card with a retractable sheath positioned to cover either a device connector or a shieldless USB tab.
Figure 4B:
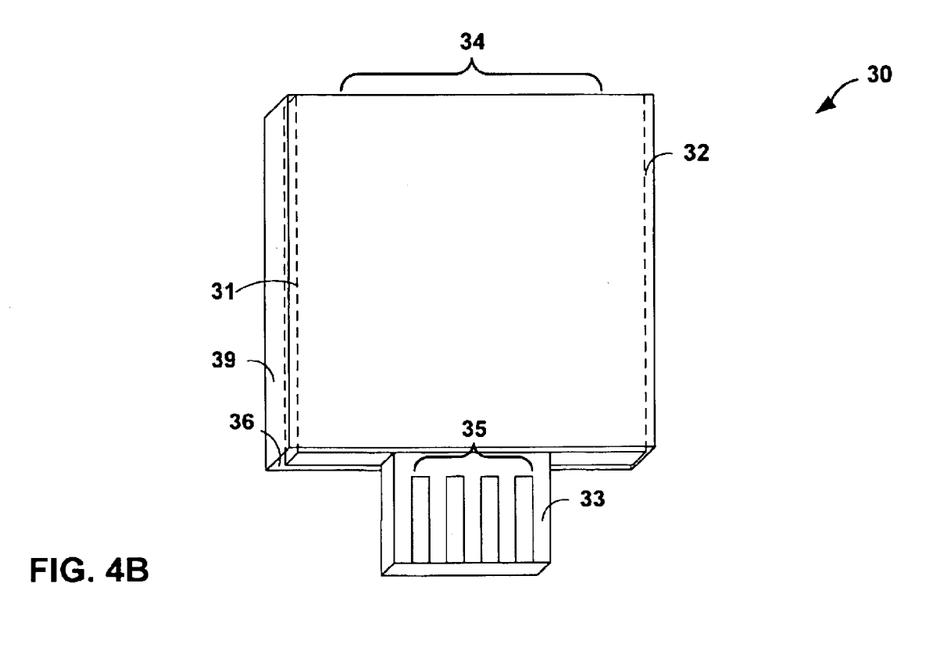

FIGS. 4A and 4B are perspective views of an exemplary memory card 30 with a retractable sheath 39 positioned to cover either a device connector 32 or a shieldless USB tab 33. As shown, retractable sheath 39 retracts over either device connector 32 or shieldless USB tab 33, but not both at the same time. A locking mechanism, as described above, may temporarily lock retractable sheath 39 in a position covering device connector 32 or a position covering shieldless USB tab 33.

Retractable sheath 39 is shown in FIG. 4A in a position to cover shieldless USB tab 33. When covering shieldless USB tab 33, retractable sheath 39 protects shieldless USB tab 33 from breakage and prevents damage to USB electrical contacts 35. In this position, device connector 32 can be inserted into a device compatible with the device connector. In this manner, the device may access memory within memory card 30.

FIG. 4B shows retractable sheath 39 in a position allowing access to shieldless USB tab 33. In this position, shieldless USB tab 33 can be inserted into a computer interface compatible with the shieldless USB tab. In this manner, the computer may access memory within memory card 30. When covering device connector 32, retractable sheath 39 protects electrical contacts 34 of device connector 32, which are on housing 31.

With the retractable sheath 39 over housing 31, the dimensions of memory card 30 may substantially conform to dimensions of a memory card standard. More specifically, the dimensions of memory card 30 may include a height (H) of approximately 32 mm and a width (W) of approximately 24 mm. In one embodiment, the dimensions of memory card 30 further include a thickness (T) of approximately 1.4 mm or approximately 2.1 mm.

As shown in FIGS. 4A and 4B, retractable sheath 39 is sized to fit over at least a portion of a housing 31. A device connector opening 36 in retractable sheath 39 defines a size that allows access to device connector 32 when retractable sheath 39 is in a first position. A host connector opening 36 in retractable sheath 39 defines a size that allows access to shieldless USB tab 33 when retractable sheath 39 is in a second position.

In one embodiment, a width and thickness of a portion of housing 31 between device connector 32 and shieldless USB tab 33 are slightly less than the standard dimensions of a memory card standard. This allows sheath 39 to retract over housing 31, while the dimensions of memory card 30 still substantially conform to dimensions of a memory card standard. In another embodiment, the width and thickness of the portion of housing 31 between device connector 32 and shieldless USB tab 33 conform to the dimensions of the memory card standard, but the width (W) and thickness (T) of the retractable sheath 39 are slightly greater than the dimensions of a memory card standard. This also allows sheath 39 to retract over housing 31, while the dimensions of memory card 30 still substantially conform to dimensions of a memory card standard.

Figure 5:
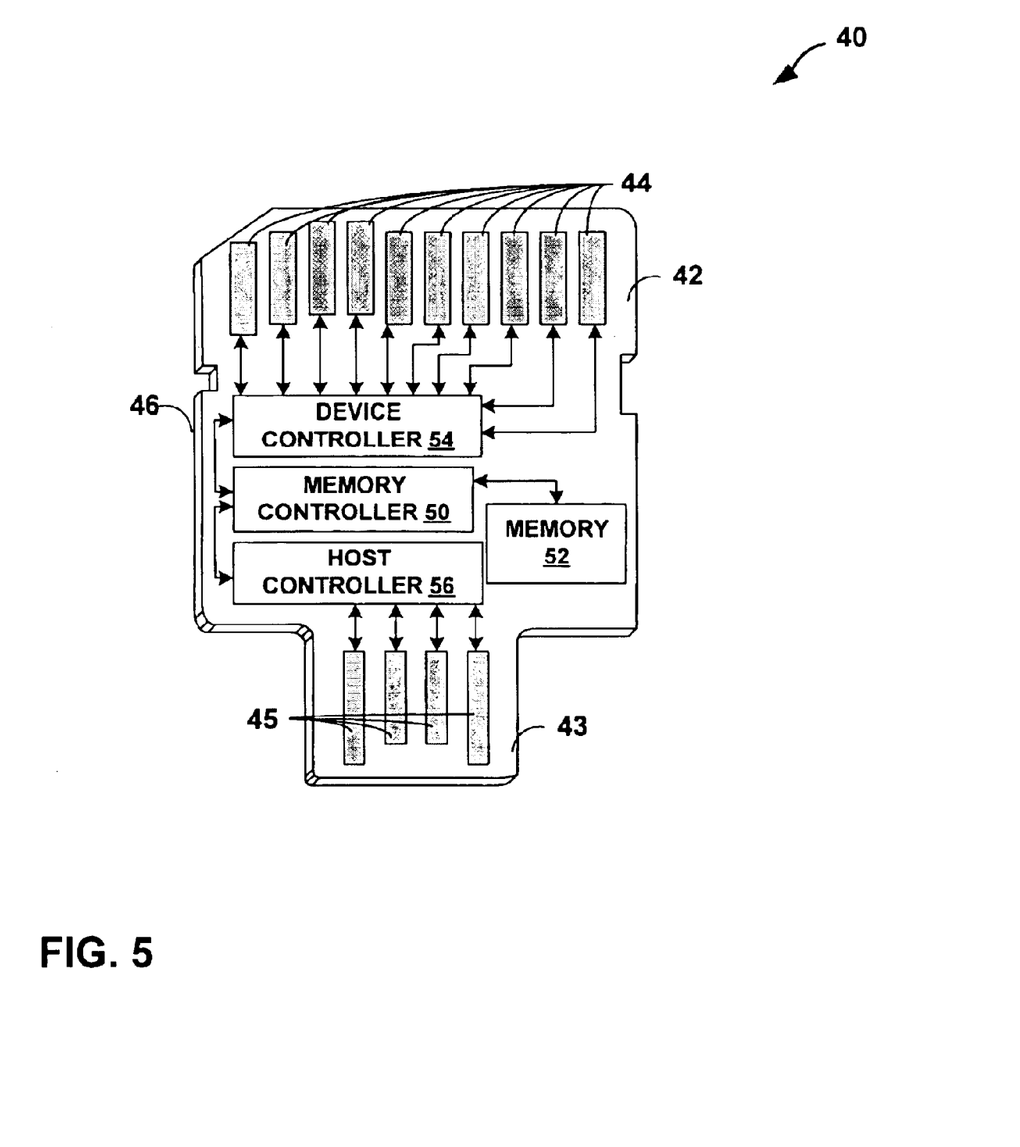
FIGS. 5–8 are block diagrams illustrating an exemplary memory cards according to embodiments of the invention.

FIG. 5 is a block diagram illustrating an exemplary memory card 40 according to embodiments of the invention. Memory card 40 includes a device connector 42 on housing 46, and a shieldless Universal Serial Bus (USB) tab 43 protruding from the housing. In particular, housing 46 and shieldless USB tab 43 define memory card dimensions that substantially conform to dimensions of a memory card standard. As shown, the dimensions of memory card 10 substantially conform to the dimensions of a MultiMedia Card standard or a Secure Digital standard. More specifically, the dimensions of memory card 40 may include a height of approximately 32 mm and a width of approximately 24 mm. In one embodiment, the dimensions of memory card 40 include a thickness of approximately 1.4 mm or approximately 2.1 mm.

In order to decrease potential problems associated with the fragile nature of shieldless USB tab 43, a sheath (not shown in FIG. 5) is added to the memory card 40 to cover the shieldless USB tab 43. The sheath may be positioned to cover the shieldless USB tab 43, and to allow the device connector 42 to be inserted into a portable device compatible with the device connection standard. Alternatively, the sheath may be positioned to cover device connector 42, and to allow the shieldless USB tab 43 to be inserted into a computing device compatible with the shieldless USB tab 43.

As shown in FIG. 5, memory card 40 may include a memory 52 and three control units. The control units include memory controller 50, device controller 54, and host controller 56. Device connector 42 may be electrically coupled to memory 52 via device controller 54 and a memory controller 50. Shieldless USB tab 43 may be electrically coupled to memory 52 via host controller 56 and memory controller 50. By way of example, memory 52 may comprise one or more elements of flash memory, electrically-erasable-programmable-read-only-memory (EEPROM), non-volatile random-access-memory (NVRAM), and other nonvolatile or volatile memory types, such as synchronous dynamic random-access-memory (SDRAM), or the like. Memory 52 may include a plurality of such memory elements in order to support large memory capacity.

In one embodiment, memory controller 50 can accept firmware updates from host controller 56 via shieldless USB tab, allowing for easy upgrades of memory card 40. Memory 52 may include one or more flash ROM elements partitioned to store such firmware in a first section and use the remaining memory for standard storage capabilities. Thus, firmware updates may be stored in a first partitioned section of the memory and a data storage area may be defined in a second section of the memory. Moreover, memory controller 50 may repartition memory 52 at the time a firmware update is received. This will ensure adequate storage space if the firmware update is larger than the original firmware and will improve storage capabilities of the memory card if the firmware update is smaller than the original firmware.

Power is applied to memory card 40 when it is connected via a device connection standard to a portable device or via a host connection standard to a computing device. The application of power allows the portable device or computing device to determine which electrical contact elements are active. Accordingly, the portable device or computing device can determine which of device connector 42 and shieldless USB tab 43 is being used based on which electrical contact elements are active.

Device controller 54 or host controller 56 is enabled to facilitate access to memory 52, depending on which of device connector 42 and shieldless USB tab 43 is being used. Communication between the portable device or computing device and memory controller 50 may then be sent through the powered connector and the enabled controller. The portable device or computing device may read or modify data that is stored in memory 52 as well as store new data or erase existing data. Memory controller 50 manipulates the data stored in memory 52 according to operations specified by the portable device or computing device.

As described above, a sheath may be used for protecting memory card 40. In some standards, memory card 40 may comprise ridges that extend from device connector 42 between the electrical contacts 44 of device connector 42. In a similar manner, memory card 40 may comprise ridges that extend from shieldless USB tab 43 between the electrical contacts 45 of shieldless USB tab 43. The ridges prevent substantial contact with the electrical contacts 45. In that case, a sheath can further protect the contacts.

Figure 6:
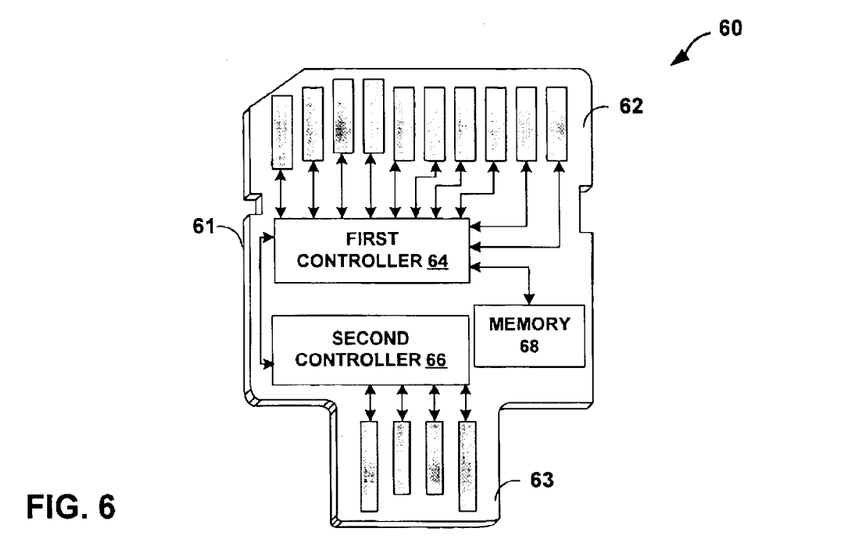

FIG. 6 is a block diagram illustrating an exemplary memory card 60 that can be used according to embodiments of the invention. Memory card 60 includes a memory 68, a device connector 62, a shieldless Universal Serial Bus (USB) tab 63, a first controller 64, a second controller 66, and a housing 61.

As in FIG. 5, memory 68 may comprise flash memory such as one or more elements of flash ROM, electrically-erasable-programmable-read-only-memory (EEPROM), non-volatile random-access-memory (NVRAM), and other nonvolatile or volatile memory types, such as synchronous dynamic random-access-memory (SDRAM), or the like.

The architecture of memory card 60 differs from that of memory card 40. Whereas, the architecture shown in FIG. 5 utilizes three separate controllers, i.e., one for device connector 42, one for shieldless USB tab 43, and one for the memory 52, the embodiment of FIG. 6 integrates the memory controller with the controller for device connector 62 as a first controller 64. Such an integrated first controller 64 may consume less space and power than separate controllers. Moreover, controllers that integrate memory and device connector controllers are commercially available and commonly used in conventional memory cards that do not include host connectors.

First controller 64 controls memory 68 and output via device connector 62. The second controller 66 controls output via shieldless USB tab 63. Device connector 62 may be electrically coupled directly to first controller 64 and then to memory 68. Shieldless USB tab 63 may be electrically coupled to memory 68 via second controller 66.

Memory card 60 may also include first controller 64 conforming to a flash memory controller, memory 68 conforming to a flash memory, and second controller 66 conforming to a flash memory 68 and USB controller. These components are readily available due to their wide usage in traditional removable memory cards and adapters or readers. Flash memory controllers are manufactured by SanDisk™ Corporation and Lexar Media Inc., among others. Many companies including Intel, Samsung, and Toshiba produce flash memory. USB controllers are typically found in flash memory card adaptors or readers and other devices utilizing USB connectivity. Such controllers are available from Cypress Semiconductor Corporation, Philips Semiconductors, and many other semiconductor companies. In this embodiment, substantially all the elements included in memory card 60 are commercially available for other uses and may be purchased directly from the manufacturer.

Memory card 60 may also include device connector 62 conforming to a device connection standard and shieldless USB tab 63 conforming substantially to a USB standard. In that case, memory card 60 functions as an external storage device that is able to couple to a computing device via several ports conforming to different device connection standards. The embodiment illustrated in FIG. 6 may also allow for firmware updates by using shieldless USB tab 63 to receive such updates from a host computer.

Figure 7:
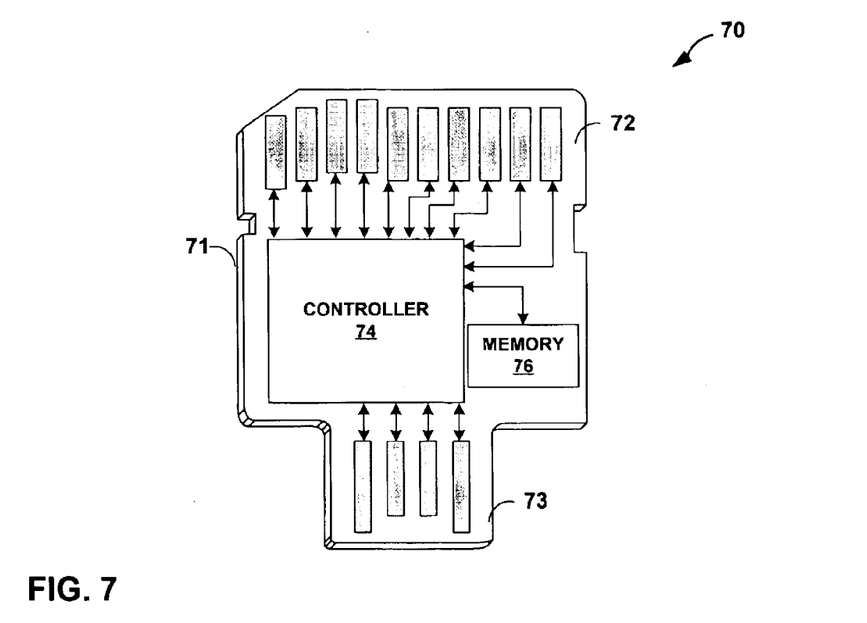

FIG. 7 is a block diagram illustrating another exemplary memory card 70 that can be used according to embodiments of the invention. As shown, memory card 70 includes a memory 76, a device connector 72, a shieldless Universal Serial Bus (USB) tab 73, a housing 71, and a controller 74. Controller 74 comprises a memory controller integrated with a device connector controller and a USB controller. Whereas the architecture shown in FIG. 5 utilizes a separate controller for each connector 42, 43 and the memory 52, controller 74 integrates such functionality of three different controllers into a common unit. By integrating the functionality of each separate controller into controller 74, less space and power may be consumed on memory card 70.

Controller 74 controls the memory 76 and output via device connector 72 or shieldless USB tab 73. Device connector 72 may be electrically coupled directly to controller 74 and then to memory 76. Shieldless USB tab 73 may also be electrically coupled to memory 76 via controller 74.

Memory card 70 may include controller 74 conforming to a flash memory controller with USB control and memory 76 conforming to a flash memory. Device connector 72 may couple to a portable device contact conforming to the MultiMedia Card or Secure Digital standard. Shieldless USB tab 73 may couple directly to a computing device's USB port allowing communication between the computing device and controller 74 without an adaptor or reader. The flash memory controller with USB control may be developed as an application specific integrated circuit (ASIC) integrating the functionality of a conventional flash memory controller and a USB controller. The embodiment illustrated in FIG. 7 may also allow for firmware updates by using shieldless USB tab 73 to receive such updates from a host computer.

Figure 8:
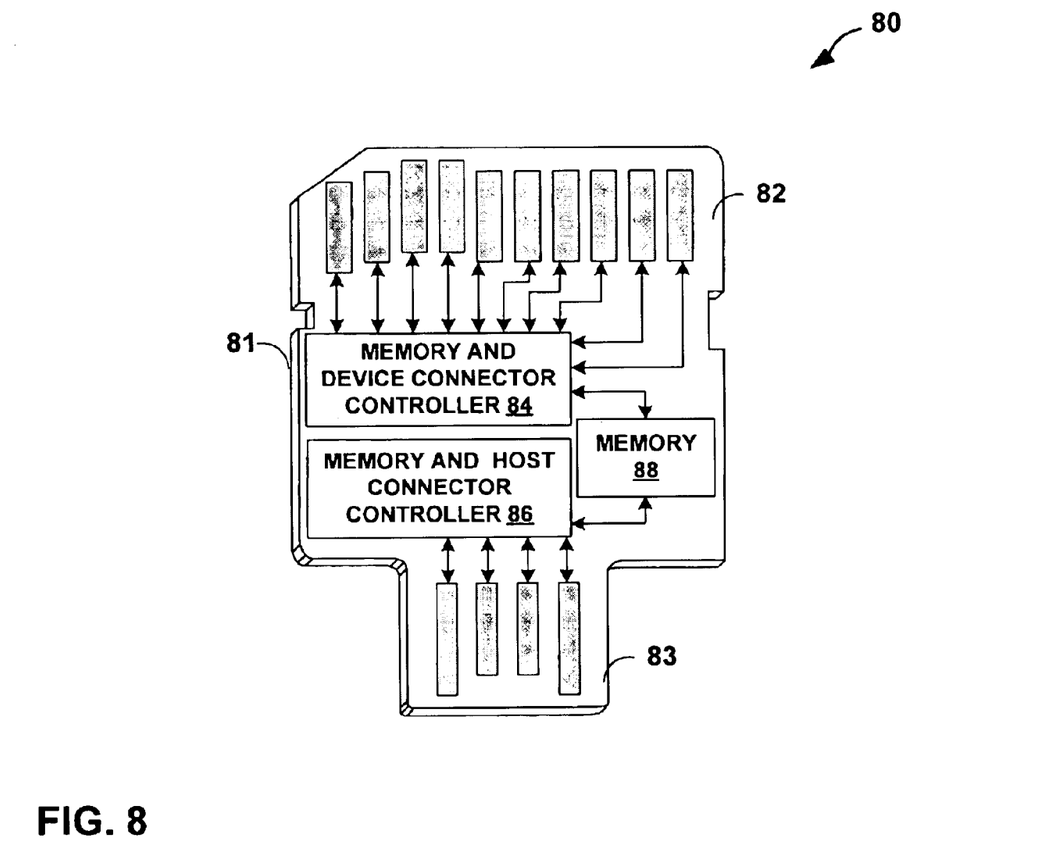

FIG. 8 is a block diagram illustrating another exemplary memory card 80 that can be used according to embodiments of the invention. As shown, memory card 80 includes a memory 88, a device connector 82, a memory and device connector controller 84, a memory and host connector controller 86, and a host connector 83. Memory 88, device connector 82, and host connector 83 may operate substantially similar to memory 52, device connector 42 and host connector 43, respectively, from FIG. 5.

Whereas the architecture shown in FIG. 5 utilizes three separate controllers, i.e., one for device connector 42, one for device connector 43, and one for memory 52, the embodiment of FIG. 8, integrates memory control into the controller for device connector 82 as a common memory and device connector controller 84, substantially similar to first connector controller 64 from FIG. 6. Memory control is also integrated into the controller for host connector 83 as a common memory and host connector controller 86. Such integrated controllers 84, 86 may consume less space and power than three separate controllers. Moreover, controllers that integrate the memory and connector controls are commercially available for use in conventional memory cards that include a memory and a single device connector. Additionally, controllers that integrate the memory and host connector controls are also commercially available for use in conventional portable memory drives that include a memory and a single host connector.

Memory and device controller 84 controls memory 88 and output via device connector 82. Memory and host controller 86 also controls memory 88 and output via host connector 83. Device connector 82 may be electrically coupled to memory 88 via memory and device controller 84. Host connector 83 may be electrically coupled to memory 88 via memory and host controller 86.

In one embodiment of the invention, memory card 80 includes device connector 82 conforming to a Secure Digital or MultiMedia Card standard and host connector 83 conforming to an USB standard. Memory card 80 also includes memory and device controller 84 conforming to a flash memory card controller, memory 88 conforming to a flash memory, and memory and host controller 86 conforming to a flash memory drive controller. These components are readily available due to their wide usage in traditional removable memory cards and traditional removable memory drives. In this embodiment, all the elements included in memory card 80 are already being produced for other purposes-and may be purchased directly from the manufacturer.

Various embodiments of the invention have been described. For example, memory cards, including a device connector and host connector, have been described that have dimensions substantially conforming to dimensions of a memory card standard. As mentioned, the dimensions may include a height of approximately 32 mm, and a width of approximately 24 mm.

Although various embodiments have been described in the context of the MultiMedia Card standard or the Secure Digital standard, various features described herein may also find use with other standards. For example, the memory card including one or more features described herein may alternatively conform to a Compact Flash standard, a Smart Media standard, a Memory Stick standard and subsequent versions including Memory Stick Pro standards and Memory Stick Duo standards, an xD standard, a yet released standard, or the like. However, the protection of the device connector is particularly desirable for standards such as MultiMedia and Secure Digital in which the electrical contacts are exposed on the housing and not protected by ridges or the like.

The host connector of the memory card has been exemplified by a shieldless USB tab. As discussed above, it may be necessary to use a shieldless USB tab if the memory card standard has a thickness that is less than the thickness of a conventional USB tab. Alternatively, the host connector may comprise a personal computer memory card international association (PCMCIA) standard including a 16 bit standard PC Card standard and a 32 bit CardBus standard, a Universal Serial Bus (USB) standard, a Universal Serial Bus 2 (USB2) standard, an IEEE 1394 FireWire standard, a Small Computer System Standard (SCSI) standard, an Advance Technology Attachment (ATA) standard, a serial ATA standard, a Peripheral Component Interconnect (PCI) standard, a PCI Express standard, a conventional serial or parallel standard, or the like. The standards described herein refer to such standards as defined on the filing date of this patent application. These and other embodiments are within the scope of the following claims.

What is claimed is:

1. A memory card comprising:
   a housing;
   a memory in the housing;
   a device connector on the housing, the device connector conforming to a device connection standard and allowing access to the memory by a device compatible with the device connection standard; and
   a host connector protruding from the housing, the host connector conforming to a host connection standard and allowing access to the memory upon insertion of the host connector into a computer interface compatible with the host connection standard, wherein the housing and the host connector protruding from the housing define memory card dimensions which substantially conform to dimensions including a height of approximately 32 mm, and a width of approximately 24 mm.

2. The memory card of claim 1, wherein the device connection standard comprises one of a MultiMedia Card standard and a Secure Digital standard.

3. The memory card of claim 1, wherein the host connection standard comprises a Universal Serial Bus (USB) standard.

4. The memory card of claim 1, wherein the host connector comprise a shieldless tab.

5. The memory card of claim 1, further comprising a memory card control unit that accepts firmware updates via the host connector interface.

6. The memory card of claim 5, wherein the memory is partitioned such that the firmware updates are stored in a first partitioned section of the memory and a data storage area is defined in a second section of the memory.

7. The memory card of clam 1, wherein a thickness of the memory card is one of approximately 1.4 mm and approximately 2.1 mm.

8. The memory card of claim 1, wherein the host connector protrudes from an edge of the memory card, wherein a thickness of the host connector is less than or equal to the thickness of the memory card.

9. The memory card of claim 1, further comprising a retractable sheath that can be positioned in a first position to cover the host connector and expose the device connector, and a second position to cover the device connector and expose the host connector.

10. The memory card of claim 9, wherein the housing and the retractable sheath collectively define a form factor of the memory card that substantially conforms to a form factor of the memory card standard when the retractable sheath is positioned in the first position to cover the host connector.

11. A memory card comprising:
   a housing;
   a memory device in the housing;
   a device connector including one or more electrical contacts on the housing, the device connector conforming to a device connection standard and allowing access to the memory by a device compatible with the device connection standard;
   a host connector protruding from the housing, the host connector conforming to a host connection standard and allowing access to the memory upon insertion of the host connector into a computer interface compatible with the host connection standard; and
   a retractable sheath that can be positioned in a first position to cover the host connector and expose the device connector, and a second position to cover the device connector and expose the host connector.

12. The memory card of claim 11, wherein the host connection standard comprises one of a personal computer memory card international association (PCMCIA) standard, a PC Card standard, a CardBus standard, a Universal Serial Bus (USB) standard, a Universal Serial Bus 2 (USB2) standard, an IEEE 1394 FireWire standard, a Small Computer System Interface (SCSI) standard, an Advance Technology Attachment (ATA) standard, a serial ATA standard, a Peripheral Component Interconnect (PCI) standard, and a PCI Express standard.

13. The memory card of claim 11, wherein the host connection standard comprises a Universal Serial Bus (USB) standard, and the device connection standard comprises one of a MultiMedia Card standard and a Secure Digital standard.

14. The memory card of claim 11, wherein the host connector comprises a tab.

15. The memory card of claim 11, wherein the host connector protrudes from an edge of the memory card, wherein a thickness of the host connector is less than or equal to the thickness of the memory card.

16. The memory card of claim 11, further comprising a locking mechanism formed on either the retractable sheath or the housing to lock the retractable sheath into one of the first position and the second position.

17. The memory card of claim 11, further comprising a stopping mechanism formed on the retractable sheath to prevent removal of the retractable sheath beyond one of the first position and the second position.

18. The memory card of claim 11, wherein the retractable sheath comprises:
   a device connector opening defining a size that allows access to the device connector when the retractable sheath is in the first position; and
   a host connector opening defining a size that allows access to the host connector when the retractable sheath is in the second position.

19. The memory card of claim 11, wherein the device connection standard comprises one of a MultiMedia Card standard and a Secure Digital standard and the memory card defines a height of approximately 32 mm, and a width of approximately 24 mm.

20. The memory card of claim 11, wherein the housing and the retractable sheath collectively define a form factor of the memory card that substantially conforms to a form factor of the memory card standard when the retractable sheath is positioned in the first position to cover the host connector.

* * * * *

UNITED STATES PATENT AND TRADEMARK OFFICE
CERTIFICATE OF CORRECTION

PATENT NO. : 6,908,038 B1  Page 1 of 1
APPLICATION NO. : 10/788591
DATED : June 21, 2005
INVENTOR(S) : Trung V. Le It is certified that error appears in the above-identified patent and that said Letters Patent is hereby corrected as shown below:

Title Page
  Item (73), "Imotion Corp." should read --Imation Corp.--.
  Item (57), line 2 of Abstract, "a connector" should read --a host connector--.

Column 12
  Line 67, "comprise" should read --comprises--.

Column 13
  Line 8, "clam 1" should read --claim 1--.

Signed and Sealed this

Twenty-ninth Day of July, 2008

JON W. DUDAS
*Director of the United States Patent and Trademark Office*